(12) United States Patent
Yamamoto

(10) Patent No.: US 6,441,397 B2
(45) Date of Patent: Aug. 27, 2002

(54) EVALUATION OF SEMICONDUCTOR CHARGEUP DAMAGE AND APPARATUS THEREFOR

(75) Inventor: Masaharu Yamamoto, Otsu (JP)

(73) Assignee: Matsushita Electronics Corporation (JP)

(*) Notice: Subject to any disclaimer, the term of this patent is extended or adjusted under 35 U.S.C. 154(b) by 0 days.

(21) Appl. No.: 09/820,309

(22) Filed: Mar. 29, 2001

(30) Foreign Application Priority Data

Apr. 5, 2000 (JP) ....................................... 2000-102889

(51) Int. Cl.⁷ ............................................. H01L 23/58
(52) U.S. Cl. ............................ 257/48; 438/11; 438/14; 438/15; 438/18
(58) Field of Search ............................. 257/48; 438/11, 438/14, 15, 18

(56) References Cited

FOREIGN PATENT DOCUMENTS

| JP | 409074086 | * | 3/1997 |
| JP | 10-79407 | | 3/1998 |
| JP | 02000323582 | * | 11/2000 |
| JP | 02000332206 | * | 11/2000 |

* cited by examiner

Primary Examiner—Hoai V. Ho
Assistant Examiner—Andy Huynh
(74) Attorney, Agent, or Firm—Parkhurst & Wendel, LLP

(57) ABSTRACT

To provide a method for evaluating chargeup damage caused in the practical fabrication process. Evaluation is carried out based on the electric current flowing between the source and the drain of a MOS transistor of a semiconductor element (1—1) having a wiring layer provided with an antenna effect by installing the semiconductor element (1—1) in the periphery of a practical device installed in a semiconductor substrate and measuring the electric current without attaching a probe to the gate of the semiconductor element (1—1).

16 Claims, 14 Drawing Sheets

SURFACE AREA RATIO OF ETCHED PERIPHERAL PARTS

PATTERN SURFACE AREA RATIO

QUANTITY OF CHARGE
IN REMAINING PATTERN
PROPORTIONAL TO SURFACE AREA OF
ETCHED PERIPHERAL PARTS        D/E(EXAMPLE)

QUANTITY OF CHARGE
IN REMAINING PATTERN
PROPORTIONAL TO            D/E + RESIST REMOVAL
SURFACE AREA OF PATTERNS   (EXAMPLE)

LOOP, NON-LOOP; EACH 7.2 mm, DENSITY 1

LOOP, NON-LOOP; EACH 3.6 mm, DENSITY 1

LOOP, NON-LOOP; EACH 3.6 mm, DENSITY 1/2

EVALUATION OF SEMICONDUCTOR CHARGEUP DAMAGE AND APPARATUS THEREFOR

FIELD OF THE INVENTION

The present invention relates to a semiconductor evaluation apparatus for evaluating chargeup damage of an actual device in the semiconductor device fabrication process.

BACKGROUND OF THE INVENTION

Following the requirement of fineness in the semiconductor device fabrication process, ion implantation technique, plasma dry etching technique, and the like have been introduced in semiconductor device fabrication apparatuses and a semiconductor substrate is to be exposed frequently to an electron, ions, plasma, and the like and thus how to suppress a chargeup damage has come up as a matter in the fabrication process.

Further, requirements for fineness of elements and variety of devices are further acceleratedly increased following the system large scale integration (LSI) and the effect of the chargeup damage has become a more sensible matter for an element. Nevertheless, its mechanism and the measurement method have not yet sufficiently established and most part of the matter has been left unclear today.

Conventional evaluation methods of the chargeup damage are mainly a breakdown voltage measurement method for an ultra thin oxide film and a method using an antenna MOS transistor, an EPROM, an EEPROM and the like.

The former is a method for checking whether a gate oxide film is broken or not by using an ultra thin oxide film or checking breakdown property (TDDB: Time dependent Dielective Breakdown) with the lapse of time by forcibly applying stress by charging with electric charge.

This method is to measure the deterioration of the oxide film caused when the charged up and accumulated electric charge penetrates the gate oxide film with an ultra thin film thickness through and reaches a substrate. Problems are that the ultra thin oxide film used is not used in the relevant fabrication process and that dielectric breakdown is natural to take place if the evaluation is carried out using a thinner film to make judgment difficult.

A substrate already bearing an oxide film and produced in the outside is mounted in some cases and inserted directly in an apparatus in other cases and thus the evaluation sometimes considerably deviates from the fabrication process and the device structure. Further, since the measurement is carried out in a distraction mode, the method is insufficient in the sensitivity to detect the property alteration which does not result in the distraction mode of an actual device.

Actually, evaluation is impossible in many cases in the fabrication process of an actual device of such as a bipolar IC and an analog element of CCD. Also, the method has disadvantages that a large pattern surface area is required, it takes a long time to evaluate, and that a large number of samples are required for getting statistic data.

In the method using an antenna MOS transistor, there are many cases of using an ultra thin oxide film for the gate oxide film and in such cases, the same problems as described above are brought forth. Since evaluation is carried out in a MOS transistor, evaluation of the transistor properties and the hot carrier life properties is also made possible other than the evaluation of the withstand voltage property of the gate oxide film and the TDDB property.

Further, since the gate is composed as to have an antenna structure, actual pattern addition is possible and also evaluation of actual dry etching and resist removal in the fabrication process is made possible.

However, an electrode for measurement has to be installed in an antenna gate for evaluation measurement and for that, the charge accumulated in a floating gate is possibly discharged at the time of the process of forming a layer for the electrode.

Hence, the method probably misses the phenomenon that the gate is broken and deteriorated by the electric charge since the electric charge together with remaining charge is expelled to the antenna in the process, for example, in the film formation process by plasma oxide, after the process of layer formation for electrode.

In case of employing this method for evaluating the transistor properties by their alteration, the sensitivity is improved more than that by the withstand voltage evaluation, however in the case where the ultra thin oxide is used, it becomes difficult to make validity of the results in relation to an actual product and the actual fabrication process. Further, it also becomes difficult to grasp to which extent of the chargeup the property's alteration value is related to and to judge the chargeup is positive or negative.

In the case of employing the EEPROM, EPROM or other memory device, in many cases, the chargeup phenomenon is evaluated based on the alteration of the memory properties by setting a produced product or device as it is in an apparatus. The problems in such cases are whether the product or device can be set as it is in the apparatus and that the treatment in the actual process cannot be carried out and the device structure is different from that in the actual fabrication process.

Hence, if the evaluation is possible, it is unclear what the evaluation results imply in the actual product and the actual fabrication process of the product. Nevertheless, the extent of the chargeup can be measured based on the output electric current value and Vth, which are properties of a memory, the method gives clearer evaluation results than the former methods as above described.

Also, although the imperfect judgment, the method makes it possible to grasp whether the chargeup is positive or negative within the operation range.

Regarding the problems in the present techniques, that the evaluation element cannot be produced in the relevant process is a main and big obstacle and due to that, evaluation is carried out by way of using the ultra thin oxide film and an element such as EEPROM, EPROM with the different structure.

If the process and the device structure are different, the resistance of the contact face with a capacity and an apparatus differs and thus it can easily be supposed that the chargeup state is also different from that in the actual process and the actual product. Even in the dry etching process, actually a material to be etched is etched and an underlayer material is over etched in the situation that a resist is patterned. It is desirable that the chargeup can be evaluated at that time.

Further, although the chargeup phenomenon is supposedly affected with the CVD process, metal film growth, thermal treatment, and the like before and after the etching process and also with the hydrogen content in the film, the well structure, the wiring structure, and the like, it has not sufficiently been made clear.

DISCLOSURE OF THE INVENTION

The state of the art is described above, mainproblems arethat the measurement sensitivity is low, the measurement evaluation takes a long time, evaluation is impossible for analog elements, the evaluation constitution is insufficient to evaluate the chargeup damage caused in the actual fabrication process, the evaluation is impossible to evaluate the chargeup damage relevant to the actual product on completion of the diffusion process, and that no correlation of the evaluation results with the properties of the actual product and actual devices is made clear.

Objects of the present invention is:
1. to improve the measurement sensitivity relevant to the chargeup damage;
2. to shorten the measurement evaluation time relevant to the chargeup damage;
3. to find the chargeup damage occurring process;
4. to make evaluation possible for digital and analog elements (MOS, a bipolar IC, the CCD process);
5. to equalize evaluation to that in the actual product by simulation of the actual process and the entire process; and
6. to make a relation of the chargeup damage with the properties of the actual product and the actual device.

The means for solving the above described objects 1 to 6 are as follows:
1. to employ a floating type antenna gate or diffusion layer and both N channel and P channel elements;
2. to employ a manner of employing the numerical evaluation by using an element for evaluation and for comparison but not depending on time dependency;
3. to employ a variety of shielding films and parallel formation of a variety of antennas corresponding to the occurrence process;
4. to employ digital and analog elements (MOS, a bipolar IC, and a CCD element);
5. to simulate the actual process for an evaluation element and the entire process of the fabrication process; and
6. to simultaneously mount the chargeup damage evaluation element with the actual product and the actual device.

Hereinafter, the effects of above described means will be described.

1. The effect of the floating type antenna gate or the diffusion layer

If the extent of the chargeup is intense, charge penetrates a substrate from a gate and causes breakdown of an oxide film and if the extent is low, the charge is left as it is, and therefore, evaluation is made possible even in the process thereafter by making a floating structure and consequently, to employ the floating type antenna gate has an effect of improving the measurement sensitivity.

If an electrode is attached to the gate, the charge escapes only by bringing a probe into contact with the gate at the time of measurement. Therefore, the measurement is carried out without bringing the probe into contact with the gate to carry out evaluation based only on the electric current flowing between a source and a drain of the antenna MOS transistor. If the positive charge is accumulated in the gate, an N-type transistor is turned on and electric current flows and a P-type transistor is turned off and no electric current flows. If the negative charge is accumulated in the gate, the P-type transistor is turned on and electric current flows. In such a manner, by making both N and P type transistors ready, the effect of judging whether the charge is positive or negative can be obtained. The same effects are given in case of the diffusion layer. A floating diffusion layer is made ready and an another impurity-type diffusion layer formed as to surround the region is made ready to measure the resistance by attaching electrodes to both ends. Depending on the quantity of the charge accumulated in the floating diffusion layer, electric potential affects the resistor below and it causes change of the depletion layer width and fluctuates the resistance values. The chargeup voltage can be calculated from the alteration of the resistance values. Further even in case of a simple diffusion resistor, the same effects are made available by using a high resistance resistor. The chargeup damage to invert the surface of the low concentration diffusion layer is made possible to be detected by the leakage between high concentration diffusion layers in the low concentration diffusion layer.

2. The effect of the comparison element

A practical gate voltage of the floating type antenna gate is made possible to be calculated by comparing the output electric current of a MOS transistor having the floating type antenna gate with the gate voltage and the output electric current property of a standard MOS transistor for comparison.

In the same manner, in case of the resistance of a diffusion layer having a floating diffusion layer there above, the practical voltage of the floating diffusion layer is made possible to be calculated from the voltage and the resistance property of the lower diffusion layer by making a floating diffusion layer equipped with an electrode ready as the comparison element. In any case, since the chargeup voltage including plus and minus characteristic of the floating part can be obtained as a numerical value even by measurement of only one element by comparison with the comparison element, the measurement time can be shortened. On the other hand, in case of measurement of the withstand voltage, the measurement takes a long time since the measurement depends on the judgment whether the dielectric breakdown takes place or not and since a stable numerical value cannot be obtained unless statistic numerical value measurement is carried out.

3. The effect of using a variety of antennas and shielding film

The chargeup generation process can be found by investigating in which antennas of the layer structure the chargeup takes place by making several types of antenna gates ready in case of a MOS transistor having the floating type antenna gate. Also, the generation process can be found by investigating which layers show the shielding effect by forming a variety of types of shielding films on the antenna gate. The shielding films can be added to a resistance element, a diffusion layer leakage measurement element, and a variety of device elements and thus have the function of fining the generation process.

4. The effect of employing the digital and analog element (MOS, bipolar IC, CCD process)

Shielding films and etching layers are additionally formed in a resistance element, a diffusion layer junction leak, an NPN bipolar element, a lateral PNP element, a vertical PNP bipolar element, a photodiode-attached perpendicular CCD element, and the like and an antenna layer is additionally formed in some of elements. The films and the layers have the function of finding the effect on the properties on a practical product.

5. The effect of evaluation element by simulating practical process and entire process of fabrication process The chargeup phenomenon is sometimes not actualized unless the practical device structure is composed. For example, in case of a batch type dry etching apparatus in which substrates are to be set in a stage, the coupling capacity differs depending on the rear side state of the substrates, the oxide film remaining state, the specific resistance values of the substrates, existence of epitaxial layers, the well structure, the constitutions on the substrate upper faces, and the like. Practical fabrication process as to obtain the practical device structure is simulated.

6. The effect of simultaneous mounting of chargeup damage evaluation element with practical product and practical device By simultaneously mounting the evaluation element with the practical product, the correlation of the property of the practical product and the chargeup damage can be found. It can clearly be judged whether gate oxide film break is caused by chargeup damage and whether the remaining chargeup voltage which is not so high as to cause gate oxide film break is positive or negative and also the correlations can be made clear among the alteration of the resistance values, the surface leakage current, a variety of the device properties and product yield ratios.

An evaluation method of an embodiment 1 of the present invention for semiconductor chargeup damage is characterized in that a semiconductor element having a wiring layer having an antenna effect is installed in the periphery of a practical device or product formed in a semiconductor substrate and necessary to be evaluated, the antenna gate of the foregoing semiconductor element is composed as to have an electrode-free floating structure, and evaluation is carried out based on the electric current flowing between the source and the drain of the MOS transistor of the foregoing semiconductor element without attaching a probe to the gate.

A semiconductor device of an embodiment 2 of the present invention comprises elements for evaluation comparison characterized in that the elements are a first semiconductor element comprising a wiring layer having an antenna effect and a second semiconductor element comprising a gate having no such a wiring layer having the antenna effect but equipped with an electrode and both elements are installed in the periphery of a practical device formed in a semiconductor substrate and necessary to be evaluated.

A semiconductor device of an embodiment 3 of the present invention as described in the embodiment 2 is composed of any one of a MOS transistor, a bipolar transistor, a CCD transmission element, a CCD light receiving element, a discrete element, and a resistance element comprising a diffusion layer and a wiring layer, these elements in combination, and elements arranged in parallel and selected from them.

A semiconductor device of an embodiment 4 of the present invention as described in the embodiment 2 comprises the first semiconductor element characterized in that a plurality of elements comprising the wiring layers having the antenna effect which the first semiconductor element is provided with are installed in the periphery of the practical device while the quality, the type, the size, the surface area, the length, the width, and the intervals of the wiring layers being changed.

A semiconductor device of an embodiment 5 of the present invention as described in the embodiment 2 comprises the first semiconductor element comprising the wiring layer having solely the antenna effect or the wiring layer having the antenna effect in combination with a wiring layer having the shielding effect or the wiring layer having the antenna effect in combination with a wiring layer for which the treatment process of the semiconductor fabrication process is added.

A semiconductor device of an embodiment 6 of the present invention is characterized in that elements having N type and P type impurity types of the diffusion layers or the wiring layers of a variety of the respective semiconductor elements having the structure described in the embodiment 2 are installed in the peripheral parts, respectively.

A semiconductor device of an embodiment 7 of the present invention, in the case where the first and the second semiconductor elements having the structure as described in the embodiment 2 are diffusion layer elements, is characterized by comprising an element in which impurity diffusion layers are disposed face to face at a constant separation distance as to measure and evaluate the leakage current between impurity layers with the same impurity type and at the same time characterized in that an element which has the same structure as that of the former and in which a wiring layer, an insulating layer, or a mask layer having the antenna or shielding effect or subjected to processing treatment or an element subjected to processing treatment is formed on the upper part of the diffusion layer is installed in the periphery.

A semiconductor device of an embodiment 8 of the present invention, in the case where the first and the second semiconductor elements having the structure as described in the embodiment 2 are diffusion resistance elements, is characterized by comprising a first diffusion resistance element in which a second diffusion layer is formed in a first diffusion layer and electrodes for resistance measurement are attached to the respective ends and characterized in that a second diffusion resistance element having a structure composed by eliminating the electrode structures attached to both ends of the second diffusion layer from the above described first diffusion resistance element all together with the contact hole formation process and leaving the electrode structures attached to both ends of the first diffusion layer resistance element as they are is installed in the periphery of the first diffusion resistance element.

A semiconductor device of an embodiment 9 of the present invention, in the case where the first and the second semiconductor elements having the structure as described in the embodiment 2 are MOS transistor elements, is characterized by comprising a first antenna MOS transistor element having an electrode for measurement attached to the gate having the antenna structure and characterized in that a second antenna MOS transistor element having a floating gate structure composed by eliminating the electrode for measurement attached to the gate having the antenna structure from the above described first antenna MOS transistor element all together with the contact hole formation process is installed in the periphery of the above described first antenna MOS transistor element.

A semiconductor device of an embodiment 10 of the present invention, in the case where the first and the second semiconductor elements having the structure as described in the embodiment 2 are antenna MOS transistor elements, is characterized by comprising a first looped antenna MOS transistor element having a looped antenna gate or antenna wiring layer connected to the transistor and characterized in that a second antenna MOS transistor element composed by cutting a part of the looped antenna gate or antenna wiring layer of the above described first looped antenna MOS transistor element and making the gate or wiring layer non-looped is installed in the periphery of the above described first antenna MOS transistor element.

A semiconductor device of an embodiment 11 of the present invention, in the case where the first and the second semiconductor elements having the structure as described in the embodiment 2 are antenna MOS transistor elements, is characterized by comprising a group of first antenna MOS transistor elements having several varied intervals between neighboring antenna gate or antenna wiring layers while keeping the width of the antenna gates or the antenna wiring layers connected to the gates of the respective transistors constant and characterized in that a group of second antenna MOS transistor elements having several varied widths of the antenna gates or the antenna wiring layers connected to the gates of the respective transistors while keeping the intervals between neighboring antenna gate or antenna wiring layers constant are installed in the periphery of the above described group of the first antenna MOS transistor element.

A semiconductor device of an embodiment 12 of the present invention as described in the embodiment 11 is characterized in that one of a plurality of antenna gates or antenna wiring layers composing pattern density and having specified widths and specified intervals is connected with each gate of the respective transistors of the above described antenna MOS transistor element group.

A semiconductor device of an embodiment 13 of the present invention, in the case where the first and the second semiconductor elements having the structure as described in the embodiment 2 are antenna MOS transistor elements, is characterized by having the structure in which gates of the above described transistors are connected to the drains of other select MOS transistors, the antenna diffusion layers with the same impurity type as that of the source and drain diffusion layers of the above described MOS transistors are connected as to be overlaid on the source diffusion layers of the above described select MOS transistors, and the charge accumulated in the above described antenna diffusion layers is led to the gates of the antenna MOS transistors by turning on the gates of the above described select MOS transistors.

A semiconductor device of an embodiment 14 of the present invention, in the case where the first and the second semiconductor elements having the structure as described in the embodiment 2 are antenna MOS transistor elements, is characterized by having the structure in which gates of the above described transistors are connected to the drains of other select MOS transistors, the antenna diffusion layers having a device structure with the same impurity type as that of the source and drain diffusion layers of the above described MOS transistors or an LSI structure or an independent element structure are connected as to be overlaid on the source diffusion layers of the above described select MOS transistors, and the charge accumulated in the above described antenna diffusion layers is led to the gates of the antenna MOS transistors by turning on the gates of the above described select MOS transistors.

A semiconductor device of an embodiment 15 of the present invention as described in the embodiment 14 is characterized by comprising a structure making the operation of the device structure comprising the antenna diffusion layers therein or the above described LSI structure or the above described independent element structure possible.

A semiconductor device of an embodiment 16 of the present invention, in the case where the first and the second semiconductor elements having the structure as described in the embodiment 2 are antenna MOS transistor elements, is characterized by having the structure in which gates of the above described transistors are connected to the drains of other select MOS transistors, the antenna diffusion layers having a device structure with the same impurity type as that of the source and drain diffusion layers of the above described MOS transistors or an LSI structure or an independent element structure are connected as to be overlaid on the source diffusion layers of the above described select MOS transistors, and the charge accumulated in the above described antenna diffusion layers is led to the gates of the antenna MOS transistors by turning on the gates of the above described select MOS transistors and is characterized by having the structure in which drains of other reset MOS transistors are additionally connected to the gates of the above described antenna MOS transistor elements, sources of the above described reset MOS transistors are earthed to a substrate or an electric power source, and the charge accumulated in the gates of the above described antenna MOS transistor elements is released to the substrate or the electric power source side by turning on the gates of the above described reset MOS transistors.

A semiconductor device of an embodiment 17 of the present invention is characterized by additionally comprising a yield ratio evaluation element capable of evaluating disconnection, bridge short circuiting, interlayer leakage, wiring resistance, contact resistance, junction leakage, transistor properties or element properties relevant to the yield ratio of the diffusion layers, the wiring layers, the connection holes, transistors and a variety of elements in the respective steps of the semiconductor fabrication process or a yield ratio evaluation element comprising an address decoder circuit for detecting defective sites, other than a variety of the semiconductor elements actualized according to the embodiment 2.

DESCRIPTION OF THE EMBODIMENTS

Hereinafter, the embodiments of respective examples of the present invention will be described according to FIG. 1 to FIG. 14.

FIG. 1 shows an example wherein a MOS transistor as a semiconductor element for evaluation and for comparison having a wiring layer having an antenna effect is installed in the periphery of a practical device or product (not shown) which is installed in a semiconductor device and necessary to be evaluated.

Figure 1A:
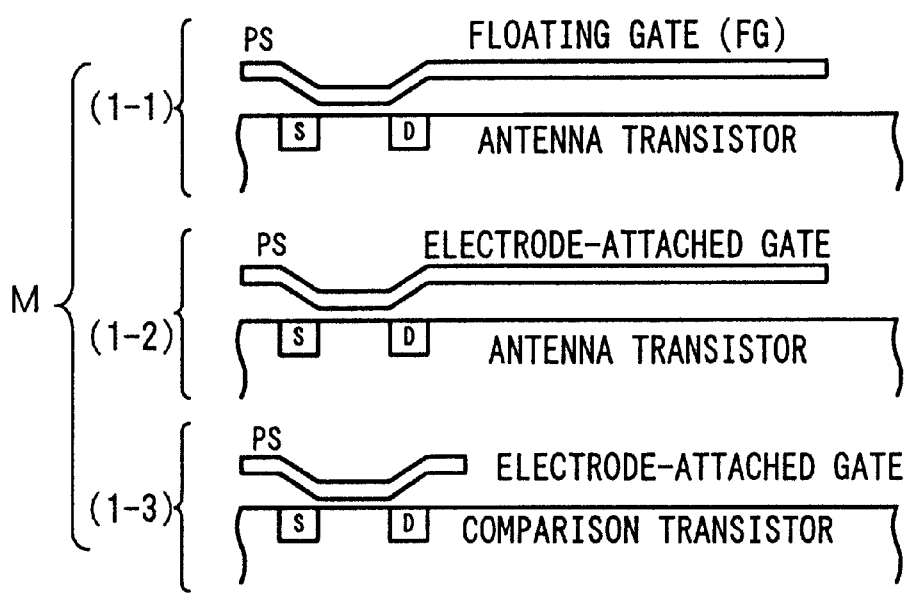
FIG. 1 are cross-section figures of a MOS transistor of an example of the present invention.
Figure 1B:
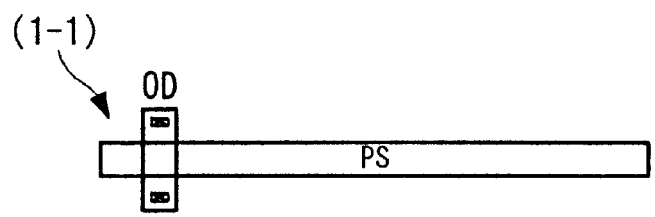

FIG. 1a shows the partial cross section figures in which the above described element for evaluation and for comparison in a semiconductor device comprising the practical device is formed. The element M for evaluation and for comparison is composed of transistors 1—1, 1-2, and 1-3.

The figure of the transistor 1—1 is a diagrammatic cross-section figure of a floating gate type antenna MOS transistor having no measurement electrode and composed of source and drain diffusion layers S, D formed in a semiconductor substrate or in a P or N well in a semiconductor substrate, a gate oxide film and a polysilicon gate. Although electrodes for measurement are connected to the source and the drain, no electrode for measurement is connected to the gate as to form a floating gate structure. Electric charge accumulated in the floating gate turns on the transistor and makes electric current flow between the source and the drain. The electric current value corresponds to the quantity of the accumulated electric charge. The transistor 1—1 has an antenna structure using polysilicon PS as it is in the polysilicon gate of the MOS transistor as illustrated in the top view of FIG. 1b seen by observing the FIG. 1a from the upper side. OD denotes the diffusion layer and the transistor region.

The transistor 1-2 is one produced by attaching an electrode for measurement to the gate of the structure of the transistor 1—1 and is enabled to measure the withstand voltage between the gate and the semiconductor substrate in the case where the gate oxide film is broken. Such a structure has conventionally mainly been used.

The transistor 1-3 is a transistor for comparison, comprises a gate, which is not an antenna gate, with the minimum surface area, and has same transistor size, gate width, and gate length as those of the transistor 1—1 and the transistor 1-2. An electrode is extended as to measure the electric current between the source and the drain and its dependency on the gate voltage.

Attributed to the dependency of the gate of the comparison transistor on the gate voltage, the gate voltage equivalent to the output electric current measured by the antenna MOS transistor of the floating gate of the transistor 1—1 can be calculated. The calculated conversion gate voltage shows the numeric value of the electric charge quantity accumulated in the floating antenna gate of the transistor 1—1.

In the case where an intense chargeup phenomenon takes place, when electric charge is discharged to the substrate side and the gate oxide film is broken or deteriorated in terms of reliability since the electric charge quantity accumulated in the antenna is high, measurement is carried out by the transistor 1-2. In this case, the transistor 1—1 is possibly broken to make measurement difficult.

When the chargeup phenomenon in a middle level takes place and the gate oxide film is not broken, the electric charge accumulated in the antenna is led out the transistor 1-3 by the floating type antenna MOS transistor of the transistor 1—1.

In such a manner, basic measurement of the charge collected by the antenna gate of the MOS transistor is made possible by using mainly the floating type gate of the transistor 1—1 in combination with the transistors 1-2 and 1-3.

Incidentally, although the antennas of the transistors 1—1 to 1-3 in FIG. 1 are drawn being extended transversely on the side of the drains D, they are differently illustrated from the actual ones due to the diagrammatic figures.

Figure 2:
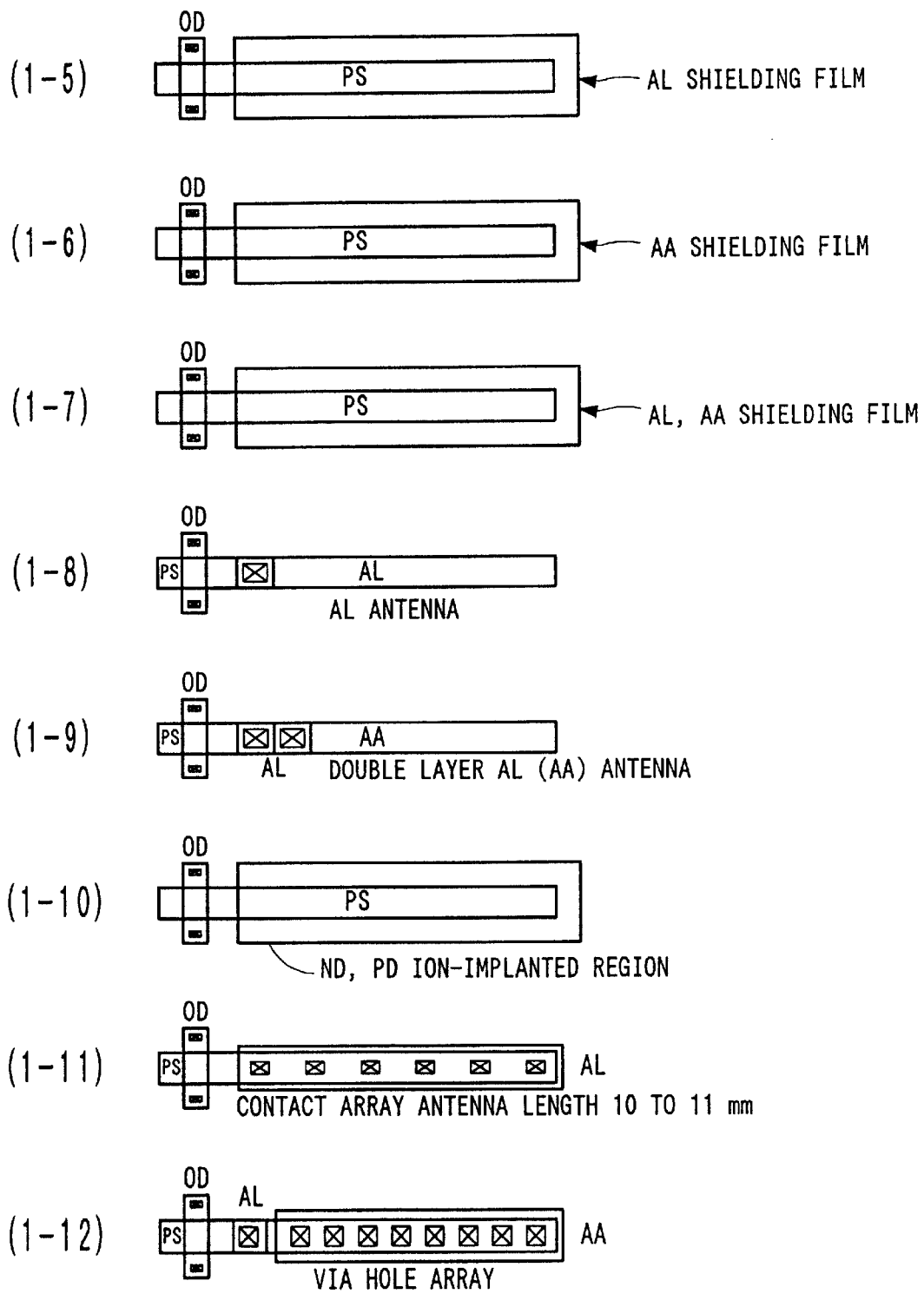
FIG. 2 are cross-section figures of a MOS transistor of an example of the present invention.

FIG. 2 are plane views of the transistors 1-5 to 1-12 of several types of examples with different antenna structure from that of the transistor 1—1. Examples using an AL wiring and an AL wiring AA of the second layer as antennas are illustrated.

The transistors 1-5, 1-6, 1-7 are examples in which the PS antennas are shielded with AL, AA (AL in the second layer), and AL and AA. In which process the chargeup takes place and led to the PS antennas can be judged by detecting the difference from the chargeup electric charge quantity in the antenna of the transistor 1—1 of FIG. 1b which is not shielded with AL.

The example illustrated as the transistor 1-8 comprises an AL wiring layer using as an antenna. The gate of the transistor is of polysilicon and connected with AL through a contact hole.

The example illustrated as the transistor 1-9 comprises the second layer AL (AA) using as an antenna. The AA is connected to the polysilicon gate through the first layer AL.

The example illustrated as the transistor 1-10 is for judging the chargeup at the time of ion implantation by assigning the ion implantation region (ND, PD) in the polysilicon antenna.

The examples illustrated as the transistors 1-11, 1-12 are those comprising a contact array and a via hole array in the antennas. The chargeup situation in the contact process and in the via hole process can be judged from the chargeup in the antenna comprising a lower layer metal wiring and an upper layer metal wiring and the chargeup in the antenna comprising the contact array and the via hole array.

FIG. 3 shows the diagrammatic graphs of I-V properties of Nch. and Pch. MOS transistors illustrating the principle of the chargeup voltage calculation of the floating antenna gate in the present invention.

The I-V properties are of a transistor for comparison and the transistors comprising a floating antenna gate for chargeup voltage measurement. The axis of abscissas shows the drain voltage Vd and the axis of ordinates shows the drain current Id.

Figure 3A:
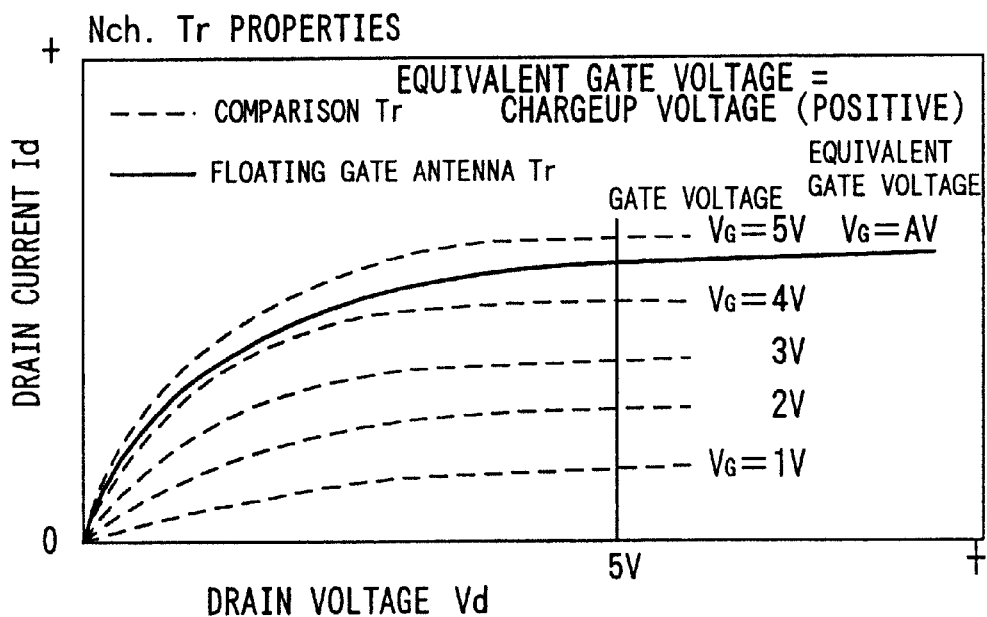
FIG. 3 are principle graphs illustrating the chargeup voltage calculation of a floating antenna gate in the present invention.
Figure 3B:
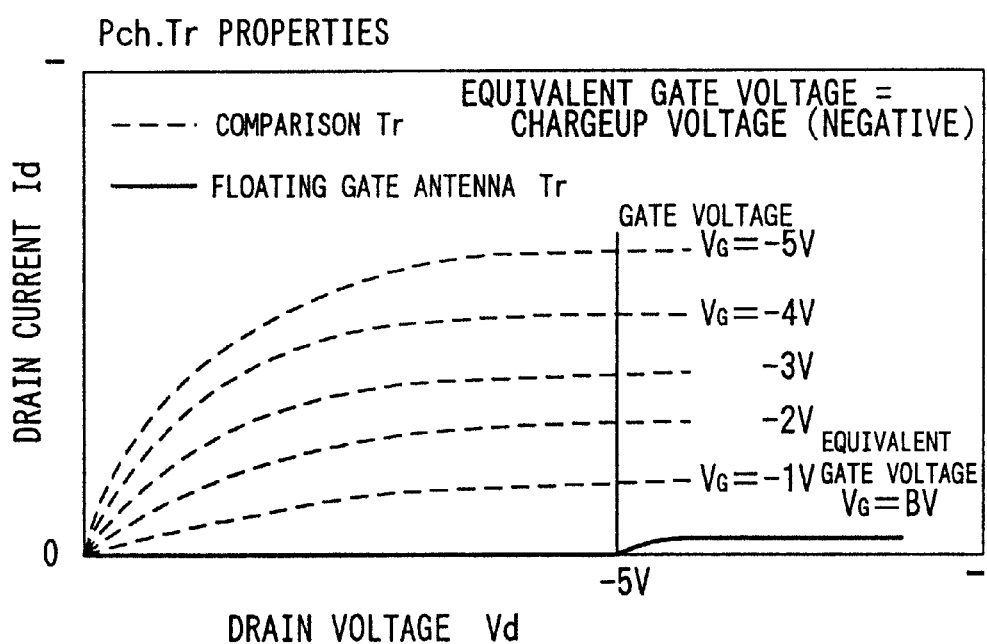
Figure 4A:
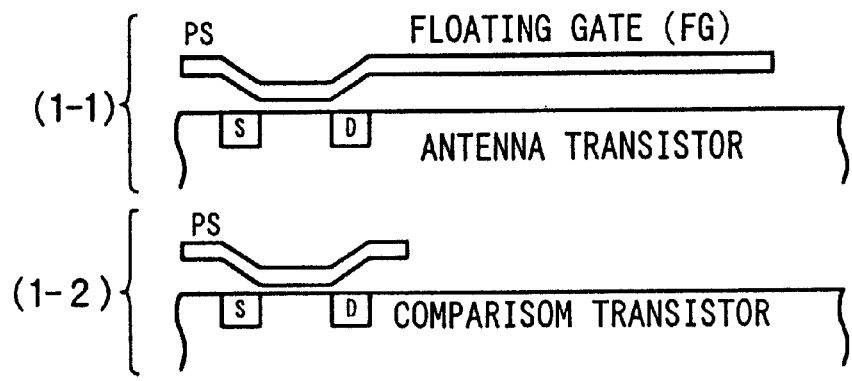
FIG. 4 are illustrations of an example of the present invention for discriminating the chargeup in the dry etching process or at the time of resist removal independently of the pattern sizes.
Figure 4B:
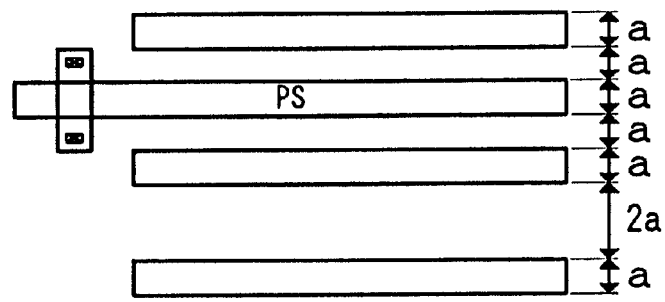
Figure 4C:
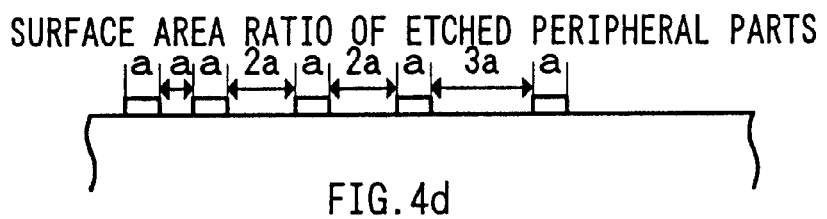
Figure 4D:
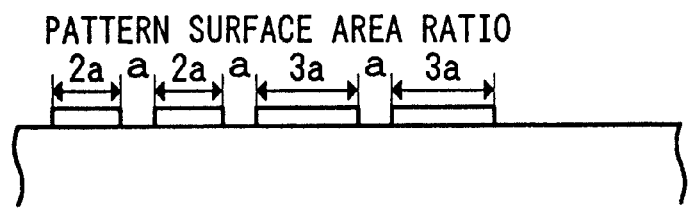

FIG. 3a shows the properties of an Nch. transistor and FIG. 3b shows the properties of a Pch. transistor. In the FIG. 3a, gate voltage is changed from 1 to 5 V as parameters for the comparison transistor in this example. The I-V properties of the floating antenna gate transistor is shown as one solid in the graph since no gate electrode is installed. The equivalent gate voltage Vg=AV conformed to the I-V property of the comparison transistor is illustrated in the graph. Since the equivalent gate voltage Vg is a practical voltage applied to the floating gate, it can be assumed to be the chargeup voltage. In order to calculate the equivalent gate voltage Vg, the dependency of the drain electric current Id of the comparison transistor on the gate voltage is measured while the drain voltage being constant (in this example at 5 V). In order to improve the precision, the gate voltage is set at every 0.1 V.

Next, the drain electric current at Vd=5 of the floating antenna gate transistor is measured and calculation is carried out by interpolating or extrapolating the equivalent gate voltage Vg=AV of the comparison transistor. The calculated value A becomes a positive value.

The value B in FIG. 3b calculated in the same manner becomes a negative value. The practical chargeup voltage is (A–B) V. By employing the above described method, the chargeup voltage accumulated in a variety of antennas illustrated in FIG. 1 and FIG. 2 and whether the charge is positive or negative can be judged.

For example, in which process the chargeup takes place and what kind chargeup takes place can be made clear based on the difference of the quantities of the charge accumulated in the PS wiring, AL wiring, and (PS+contact+AL) wiring and the like and the difference of the shielding film effect by the shielding films formed on the antennas.

FIG. 4 shows an example for discriminating the chargeup in a dry etching process and the chargeup at the time of resist removal based on the pattern size dependency using a method of the present invention. FIG. 4a 3-1 shows a floating gate type antenna MOS transistor and 3-2 shows a comparison transistor. FIG. 4b shows an example comprising polysilicon PS wiring with width (a) at intervals (a) in both sides of the polysilicon PS antenna and FIG. 4c and FIG. 4d show the pattern arrangement and the structure for measuring the dependency of the chargeup quantity on the ratio of the surface area to be etched in the peripheral parts (the ratio of the etched surface area existing between the PS patterns) and the pattern surface area ratio (the surface area ratio of the remaining PS pattern) or the circumferential length ratio.

FIG. 5 shows the measurement results of the examples described in FIG. 4.

Figure 5A:
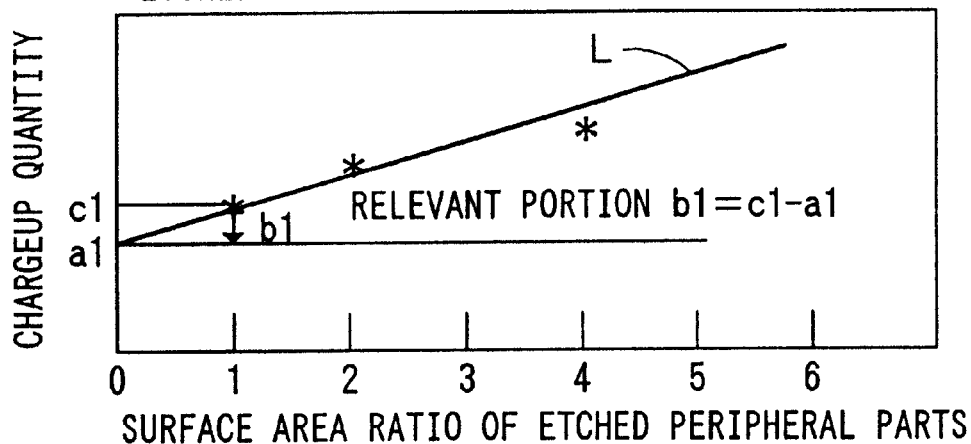
FIG. 5 are examples of the measurement results in an example of the present invention illustrated in FIG. 4.

FIG. 5a shows the example of case where the correlation of the chargeup quantity (voltage) with the peripheral surface area ratio etched exists. For example, the chargeup up is assumed to be attributed to the dry etching. In the case where the measurement results are on the straight line L as shown in the FIG., the chargeup quantity at the point of 0 of the peripheral surface area ratio etched is assumed to be $a1$ and the chargeup quantity is assumed to be $c1$ at the point of 1 of the peripheral surface area ratio. The chargeup quantity attributed to dry etching is $b1=c1-a1$.

Figure 5B:
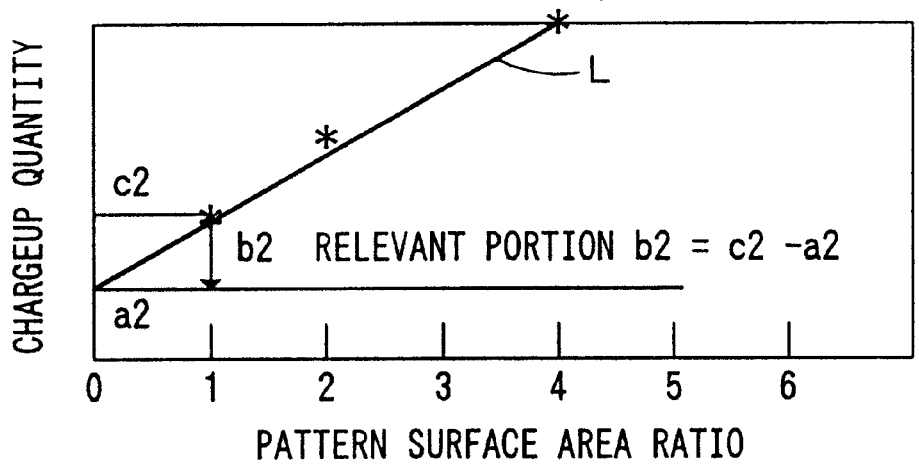

FIG. 5b shows the example of the case where the correlation of chargeup quantity (voltage) with the pattern surface area ratio exists. For example, the chargeup is assumed to be attributed to the dry etching and resist removal. In the case where the measurement results are on the straight line L as shown in the FIG., the chargeup quantity at the point of 0 of the peripheral surface area ratio etched is assumed to be $a2$ and the chargeup quantity is assumed to be $c2$ at the point of 1 of the peripheral surface area ratio. The chargeup quantity $b1$ attributed to dry etching is calculated from FIG. 5a and the chargeup quantity $b2$ attributed to the dry etching and resist removal is $b2=c2-a2$. Therefore, the chargeup quantity attributed to the resist removal is $b2-b1$. As described above, the chargeup quantity by the dry etching and the chargeup quantity by resist removal can be judged. In the same manner, in the case where the dependency on the circumferential length exists, the chargeup caused in the dry etching process and the chargeup caused in the resist removal can be discriminated from each other. In this example, the pattern dependency of the chargeup quantity caused in the dry etching and the chargeup quantity caused in the resist removal is assumed, however it is sufficient to previously find the dependency by experiments.

Figure 6A:
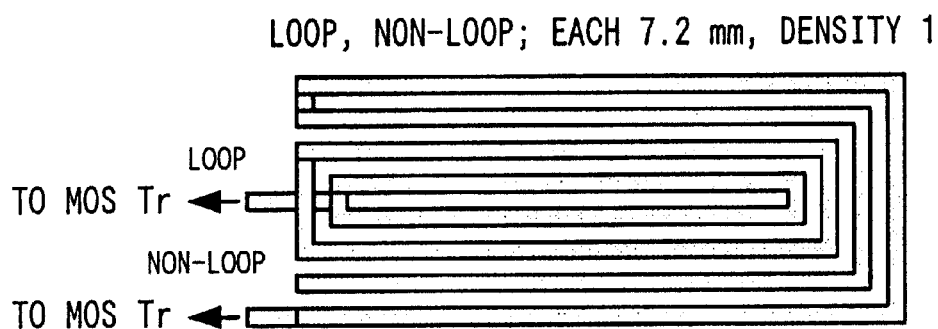
FIG. 6 are illustrations of an example of the present invention for measuring the independence of a loop antenna on the pattern density and the antenna length.
Figure 6B:
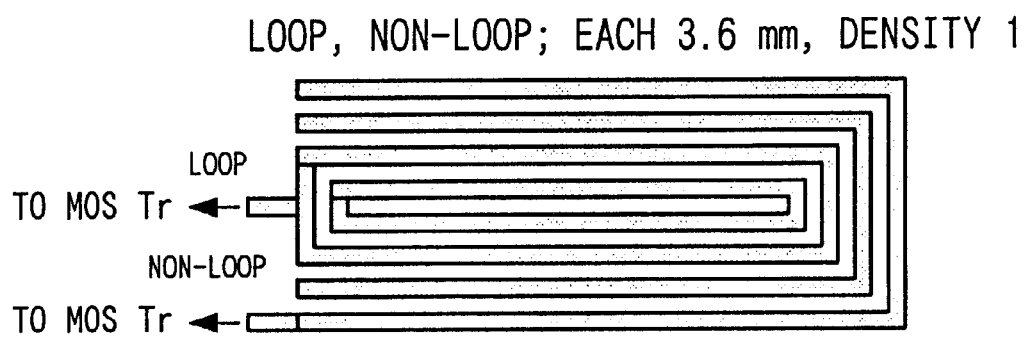
Figure 6C:
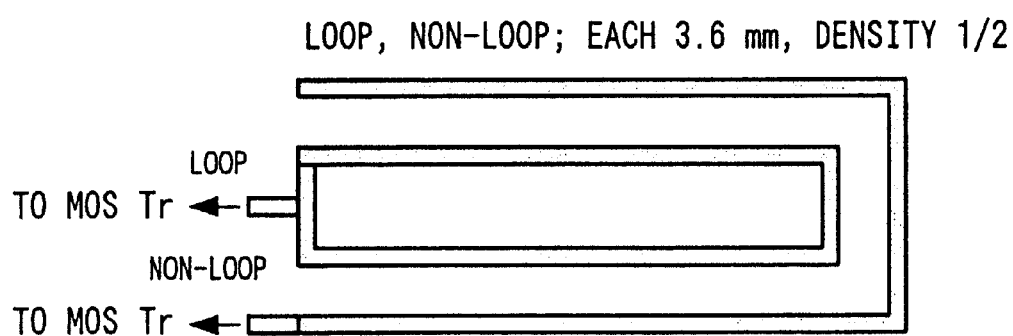

FIGS. 6a to 6c show examples carried out for finding the pattern density and antenna length dependency by installing a loop antenna and a non-loop antenna adjacently to each other in the present invention. The respective FIGS. show the case of a loop and a non-loop antennas of 7.2 mm length and 1 density, a loop and a non-loop antennas of 3.6 mm length and 1 density, and a loop and a non-loop antennas of 3.6 mm length and ½ density, respectively.

Measurement of the chargeup quantity is carried out in the same manner illustrated in FIG. 1 to FIG. 5 using a MOS transistor and a comparison transistor. The Nch., Pch., and a shielding film are also installed in the same manner. The loop antenna is employed to improve the detection sensitivity more in order to measure the chargeup which cannot be detected by a non-loop bent line type antenna which is used in common.

If the phenomenon of chargeup differs, there are some cases where the chargeup can be detected by the non-loop and bent line type antenna but not by the loop antenna. Owing to the difference of the measurement results of both antennas, both antennas are installed adjacently to each other to fine the chargeup phenomenon in details. When the plasma density fluctuates with the lapse of time or the local density unevenness is caused, induced current flows in the loop antenna and it is assumed that charge is easy to remain attributed to any cause. Further, since a loop diffusion layer and gate wiring are used in a practical device and product, the precision of the chargeup evaluation is further improved. The degree of the difference of the loop antenna and the non-loop antenna shows the instability of the plasma state and it is effective to observe the effect of the chargeup on an element.

Figure 7A:
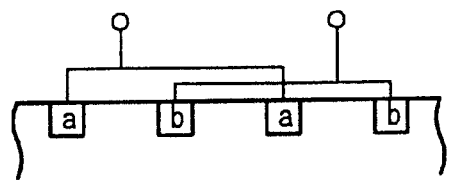
FIG. 7 are illustrations of an example of a pattern of the present invention for measuring the surface leakage between neighboring diffusion layers.
Figure 7B:
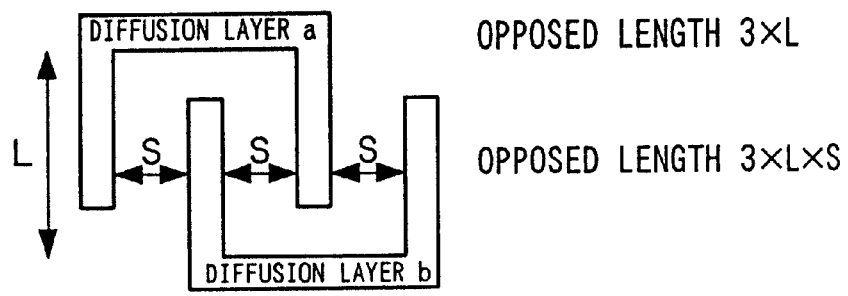
Figure 7C:
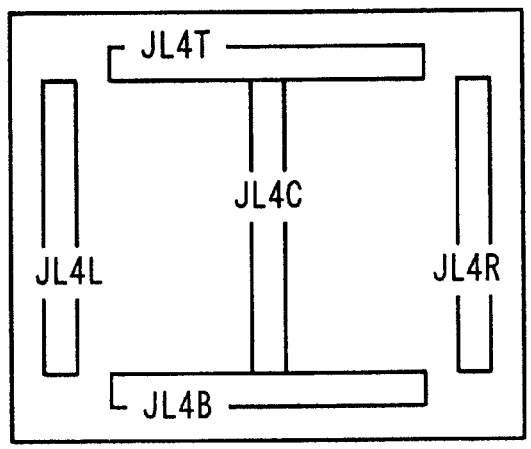

FIG. 7 is a pattern for measuring the surface leakage between diffusion layers in the present invention and shows an example in which a U shaped high concentration diffusion layer is positioned on the opposite to a low concentration diffusion layer. FIG. 7a shows the cross-section figure of the pattern for measuring leakage between diffusion layers, FIG. 7b is a top view of the pattern for measuring leakage between diffusion layers, and FIG. 7c is an in-chip arrangement figure.

The impurity type of the high concentration diffusion layer is a conduction type opposed to the impurity type of the low concentration diffusion layer. If the inversion phenomenon of the surface of the low concentration diffusion layer in the semiconductor substrate is caused by the crystal failure generated in a semiconductor substrate by chargeup or directly by the chargeup accumulated in the surface periphery, leakage current flows between the high concentration diffusion layers a-b of FIG. 7a and FIG. 7b. The leakage current attributed to the inverted layer flows on the surface. By simultaneously measuring the electric current flowing in the substrate and in a well, whether electric current is the leakage current on the surface or not can be judged. Also the process where chargeup damage occurs can be found by installing the shielding film. Since the effects of the shielding film are caused as to cut damages, trap the charge, and cut a sinter gas, sufficient investigation is required to find the generation process, however usable information can be provided. FIG. 7c shows an example in which patterns JL4T, JL4L, JL4B, JL4R, and JL4c are arranged in four corners and in the center of a semiconductor chip to measure the surface leakage between the diffusion layers shown in FIG. 7a and FIG. 7b and which is effective not only to measure the chargeup damage but also to measure the strain of the chip.

FIG. 8 shows an example using a diffusion resistance element in the present invention. The principle employed is that the effects of chargeup damages are detected based on the resistance alteration of the diffusion layer. FIG. 8a shows a floating type P-resistance (referred as to PR in FIG.) in an N-well diffusion layer (NW), FIG. 8b shows a P-resistance equipped with an electrode in the N-well diffusion layer, FIG. 8c shows a floating type P+ resistance (referred as to PD) in the N-well diffusion layer, FIG. 8d shows the N well diffusion resistance coated with a shielding film, and FIG. 8e is a top view of the floating type P-resistance in the N well diffusion layer.

Figure 8A:
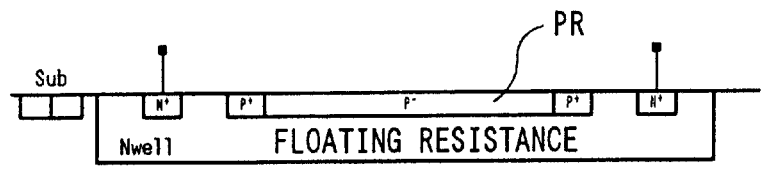
FIG. 8 are illustrations of an example of the present invention using a diffusion resistance element.

More particularly, FIG. 8a shows an example for detecting the resistance alteration of the N well diffusion layer attributed to the effect of the accumulated charge by forming an electrically floating P type low concentration diffusion layer (P−) in the N well diffusion layer. N-type high concentration diffusion layers for electrodes are formed in both ends of the N well diffusion layer to make measurement of the resistance of the N well diffusion layer possible. In FIG., although P type high concentration diffusion layers (P+) are formed in both ends of the P type low concentration diffusion layer (P−), they may be eliminated.

Figure 8B:
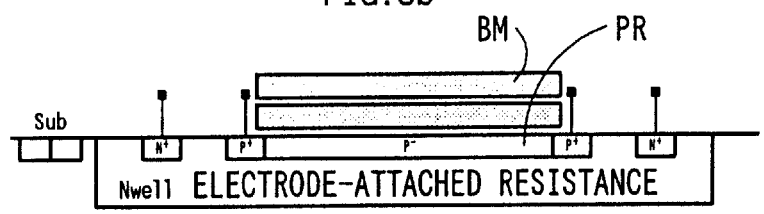

FIG. 8b shows an example comprising an electrode in the P type high concentration diffusion layers (P+) in both ends of the P type low concentration diffusion layer (P−) illustrated in FIG. 8a. The FIG. shows an example having a shielding film BM formed on the electrode-attached resistance and the P type low concentration diffusion layer (P−). The shielding film is a metal wiring layer of polysilicon PS, silicon nitride SiN, and Al.

Figure 8C:
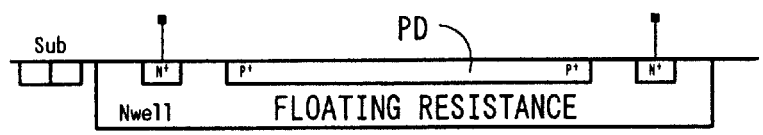

FIG. 8c shows an example comprising a P type high concentration diffusion layer (P+) in place of the P type low concentration diffusion layer (P−) of FIG. 8a, FIG. 8b. Although the FIG. shows an example having no electrode as a floating resistance, it may be possible to carry out comparative evaluation by using an example comprising an electrode.

Figure 8D:
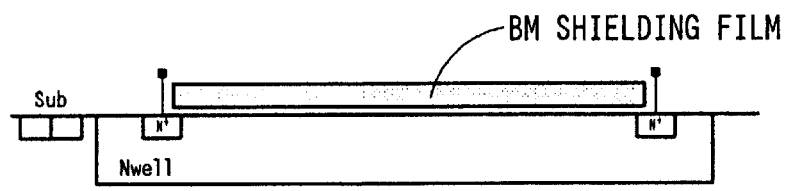
Figure 8E:
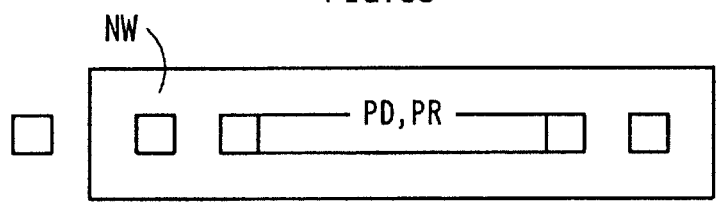

FIG. 8d shows an example using a simple N well resistance structure, useful information of chargeup damages can be obtained by adding a variety of shielding films BM and detecting the difference by the resistance values. FIG. 8e shows the top view of FIG. 8a to FIG. 8c.

FIG. 9 is the principle illustration showing the depleted region in the case where potential is generated in the P type low concentration diffusion layer (P−) in the N well illustrated in FIG. 8.

Figure 9A:
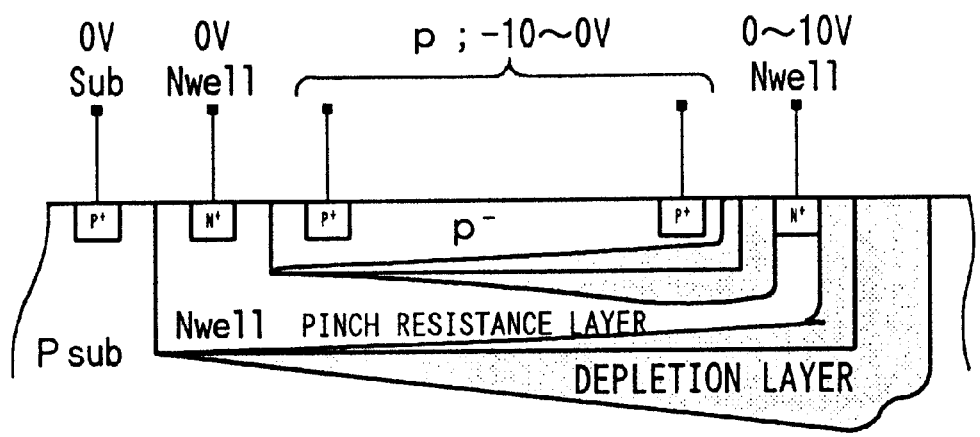
FIG. 9 are principle illustrations of FIG. 8.
Figure 9B:
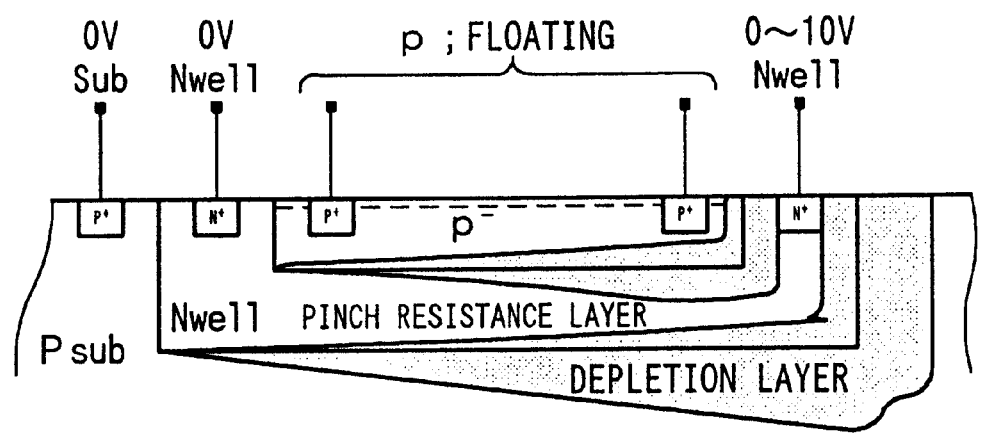

FIG. 9a shows the case where an electrode is attached to the P type low concentration diffusion layer (P−) and FIG. 9b shows the case where no electrode is attached to the P type low concentration diffusion layer (P−) and the diffusion layer is made to be floating. FIG. 9a shows the case where about 10 V voltage is applied to the electrode in the right end of the N well, 0 V voltage is applied to the electrode in the left end, and −10 to 0 V voltage is applied to the electrodes in the right and left sides of the P type low concentration diffusion layer (P−). Since the voltage applied to the P substrate, the N well, and the P− diffusion layer is higher in the right side, the depletion layer is more spread in the right side as shown in the FIG. For that, the electric carrier passage determining the N well resistance is narrowed in the right side and a pinch resistance layer with high voltage dependency is formed. The P− diffusion layer takes a role of a field plate for the N well resistance.

As same in the case where the P− diffusion layer of FIG. 9b is made to be a floating layer. The charge owing to the chargeup damage is supposed to remain as it is in the P− diffusion layer of FIG. 9b. If the potential of the P− diffusion layer changes by the chargeup or the damage, the effect is caused also on the resistance of the N well diffusion layer under.

Figure 10A:
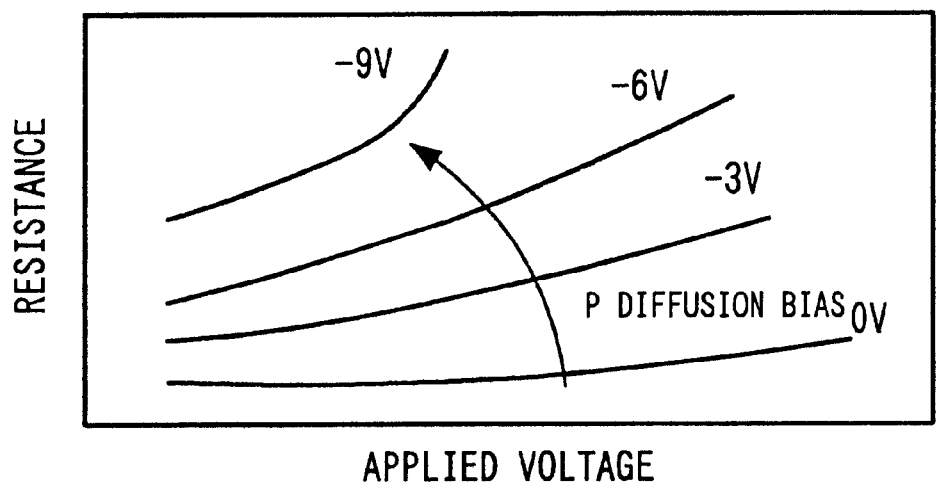
FIG. 10 are resistance-applied voltage graphs of the measurement results in FIG. 8.

FIG. 10 shows the dependency of the above described N well resistance on the applied voltage based on the principle of FIG. 9. FIG. 10a is a graph obtained by using the voltage applied to the P− diffusion layer bearing the electrode whose structure and principle are described in FIG. 8b and FIG. 9b as parameters and plotting the voltage applied to the N well in the axis of abscissas and the resistance value of the N well in the axis of ordinates. If the voltage applied to the P− diffusion layer is increased, the potential difference applied to the N well becomes wider and the extent of the depletion layer becomes wider and the resistance become higher.

Figure 10B:
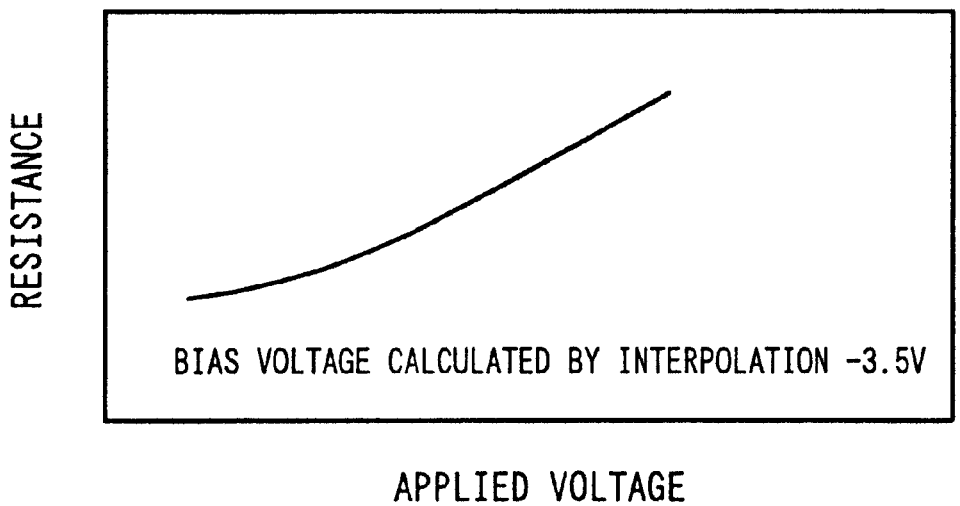

FIG. 10b is obtained by calculation of the equivalent bias voltage based on the resistance basic property and shows the graph of the dependency of the N well resistance on the applied voltage using the floating P− diffusion layer bearing no electrode whose structure and principle are described in FIG. 8a and FIG. 9b as the field plate. The voltage applied to the floating P− diffusion layer can be calculated by interpolation based on the dependency of the P− diffusion layer of FIG. 10a on the voltage. In the example of FIG. 10b, −3.5 V is written down. This value is the chargeup voltage of the floating P− diffusion layer. The calculation method is the same as that for calculating the chargeup voltage of the antenna MOS transistor of the floating gate shown in FIG. 3.

As described above, the example for measuring the chargeup voltage using the diffusion resistance by the present invention is illustrated in FIG. 8, FIG. 9, and FIG. 10.

FIG. 11 shows an example of a method for measuring the chargeup of an antenna diffusion layer of the present invention by leading it to a gate of MOS transistor. FIG. 11a shows an example of an N well diffusion layer antenna, FIG. 11b shows an example of an N+ diffusion layer antenna, FIG. 11c shows an example of an N− diffusion layer antenna, FIG. 11d shows an example of the N well diffusion layer antenna coated with a shielding film, and FIG. 11e is a top view of the example of the N well diffusion layer antenna.

More particularly, in the case where the process of forming a contact and connecting the contact with a gate by a metal wiring is carried out to measure the charge of a diffusion layer, the charge is released to the metal wiring layer through the contact and the remaining charge in the final process cannot be measured in a MOS transistor. Therefore, the connection of the antenna diffusion layer and the MOS transistor is formed using a selection transistor to lead the charge of the antenna diffusion layer to the gate of the MOS transistor for measurement by turning on and off the select gate.

Figure 11A:
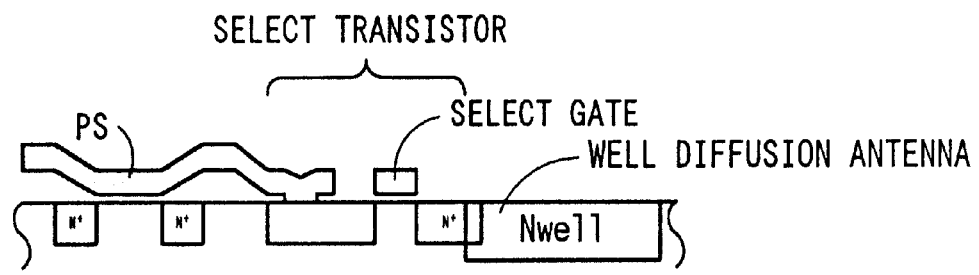
FIG. 11 are illustrations of an example of the present invention for measuring the charge of an antenna diffusion resistance layer in a MOS transistor.
Figure 11B:
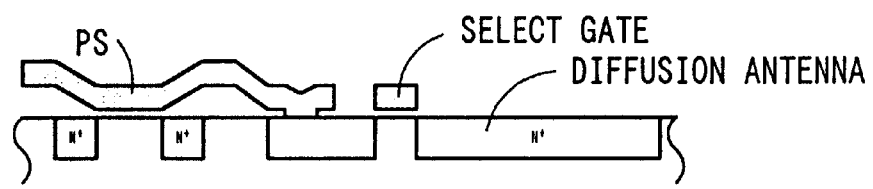
Figure 11C:
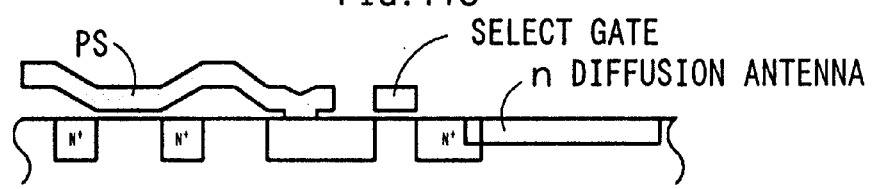
Figure 11D:
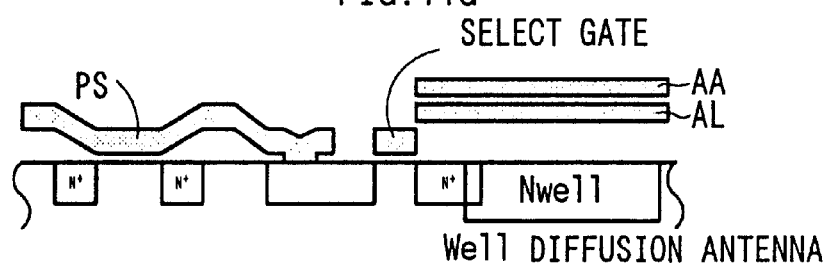
Figure 11E:
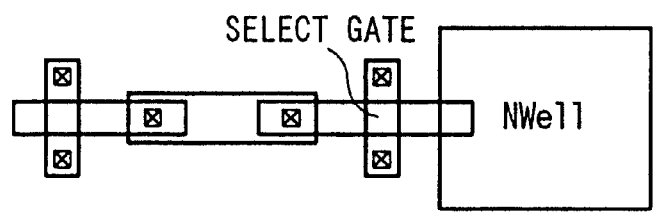

FIG. 11a shows the case where the antenna diffusion layer is an N well, FIG. 11b shows the case where the antenna diffusion layer is a high concentration N+ diffusion layer, and FIG. 11c shows the case where the antenna diffusion layer is a low concentration N− diffusion layer. FIG. 11d shows an example in which a shielding film is formed on the antenna of the N well diffusion layer. FIG. 11e is a top view of the example shown in FIG. 11a.

FIG. 12 shows the examples of a device and a bipolar element other than the antenna MOS, the resistance, and the diffusion element as explained with reference to FIG. 1 to FIG. 11. FIG. 12a is an example of an NPN transistor comprising AL, AA shielding films, FIG. 12b is an example of an L-PNP transistor comprising AL, AA shielding films, and FIG. 12c is an example of a V-PNP transistor comprising AL, AA shielding films.

Figure 12A:
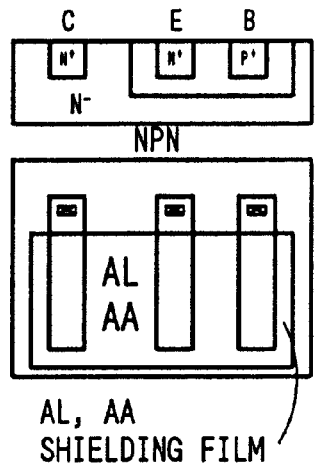
FIG. 12 are illustrations of a shielding film and the size effect of an example in a bipolar element.
Figure 12B:
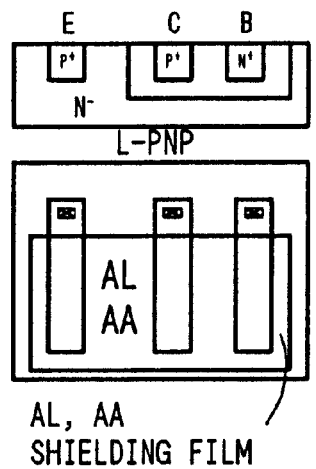
Figure 12C:
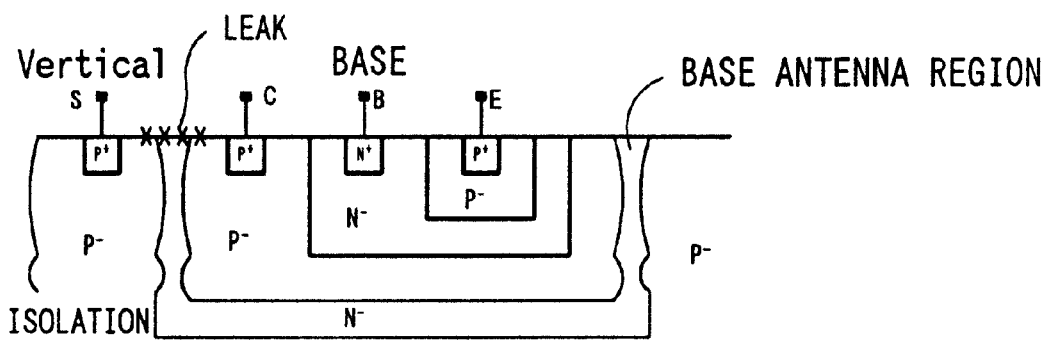
Figure 12C:
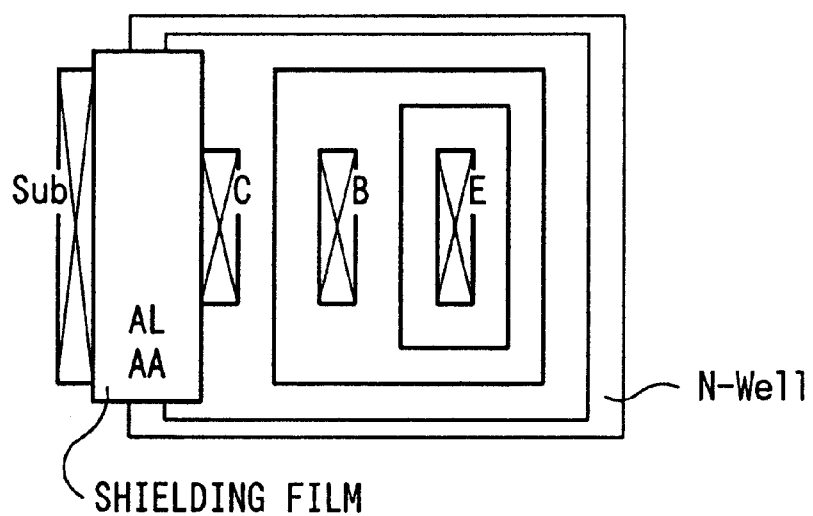

More particularly, FIG. 12a shows an NPN transistor, FIG. 12b shows a lateral (L)-PNP transistor, and FIG. 12c shows a vertical (V)-PNP transistor. Electrodes may be installed or may not be installed in some cases. The N-well of the V-PNP is made to be a floating structure. Any one of the transistors is a commonly used bipolar element in terms of the structure and composed of a collector, an emitter, a base, and a sub-electrode. The present invention makes comparison and evaluation possible by installing a device having the antenna effect together by attaching a shielding film to such bipolar transistors and making the size wider.

If withstand voltage is deteriorated between the sub-electrode and the collector in the V-PNP transistor, the inversion phenomenon of N– diffusion layer is supposed to take place, however whether the withstand deterioration is owing to chargeup or not can be detected and the process where the chargeup takes place can be found by forming a shielding film, e.g. polysilicon PS and a metal wiring layer of aluminum AL, on the N– diffusion layer and comparing the withstand voltage and the leakage respectively. Further, by comparing with other antenna MOS transistors, the surface leakage between diffusion layers, the resistance fluctuation, and the shielding film effect, the phenomenon can be made clearer and an effective countermeasure can be performed to the inferior withstand voltage and the leakage of a device.

FIG. 13 and FIG. 14 show the examples of the present invention where an array of a CCD element is used as an antenna. The charge of the CCD is led to the drain of the select transistor through the N+ diffusion layer by using the array of the CCD element as an antenna to turn the select transistor on and leading the charge to the gate of the transistor for measurement to measure the quantity of the charge accumulated in the antenna of the CCD array and the voltage based on the output current height. The principle is the same as described in FIG. 1, FIG. 3, and FIG. 11.

Figure 13A:
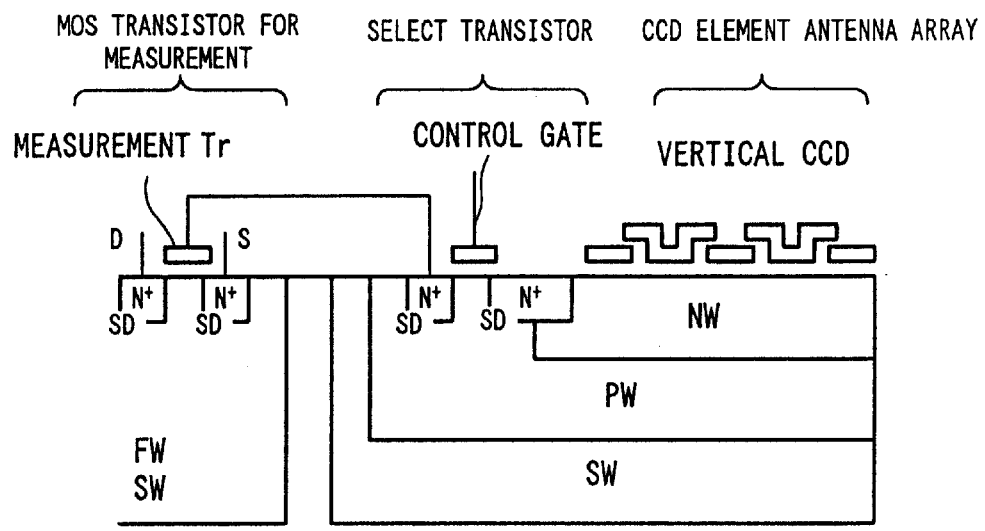
FIG. 13 are illustrations of the shielding film effect of an example in a CCD element array.

FIG. 13a shows an example where a vertical CCD array is used as the antenna. In this case, the array is connected through the N well, the charge accumulated in the N well is detected.

Figure 13B:
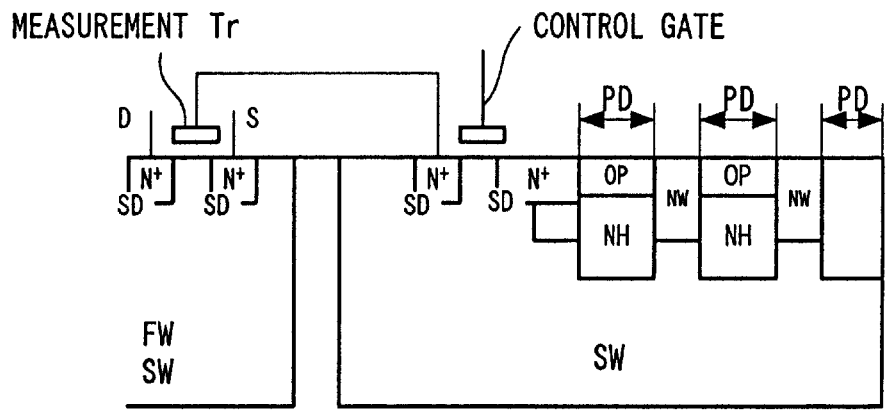

FIG. 13b shows an example where the diffusion structure of a CCD photodiode part PD is connected through the N well diffusion layer and connected to the N+ diffusion layer of the select transistor. The reference characters OP and NH show the diffusion layers formed in respective processes.

Figure 13C:
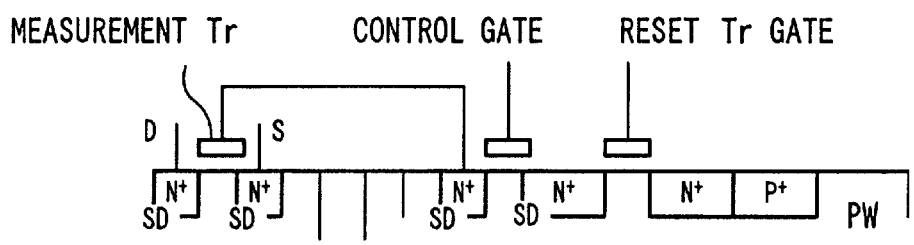

FIG. 13c shows the structure of the case where a reset transistor functioning a circuit for releasing charge accumulated in the vertical CCD part of the CCD array element and the photodiode part is connected to the select transistor.

Figure 14A:
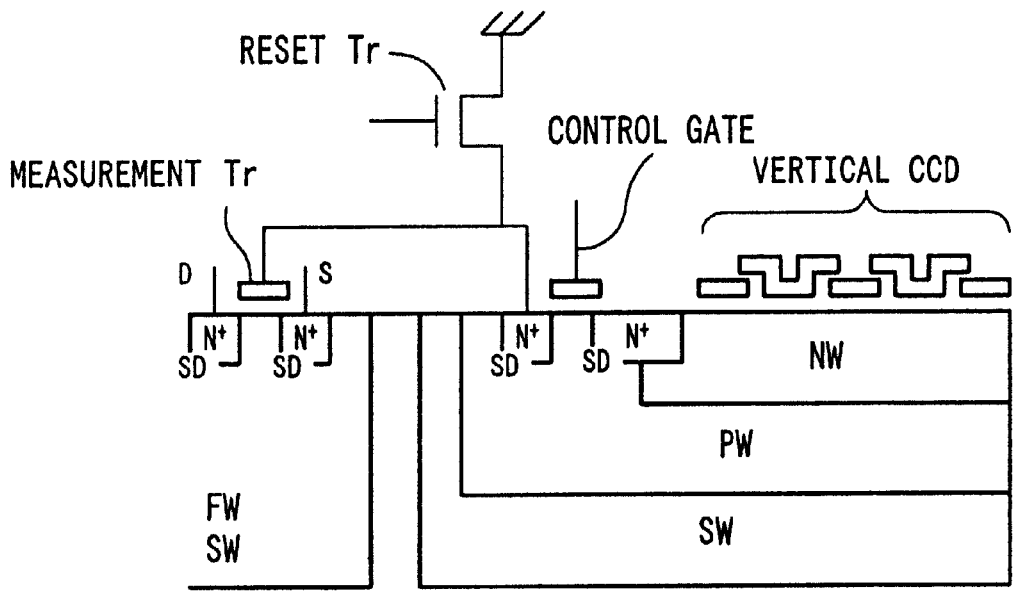
FIG. 14 are illustrations of the shielding film effect of an example in a CCD element array.

FIG. 14a shows an example of the case where a reset transistor is connected to the select transistor of the vertical CCD antenna of FIG. 13a.

Figure 14B:
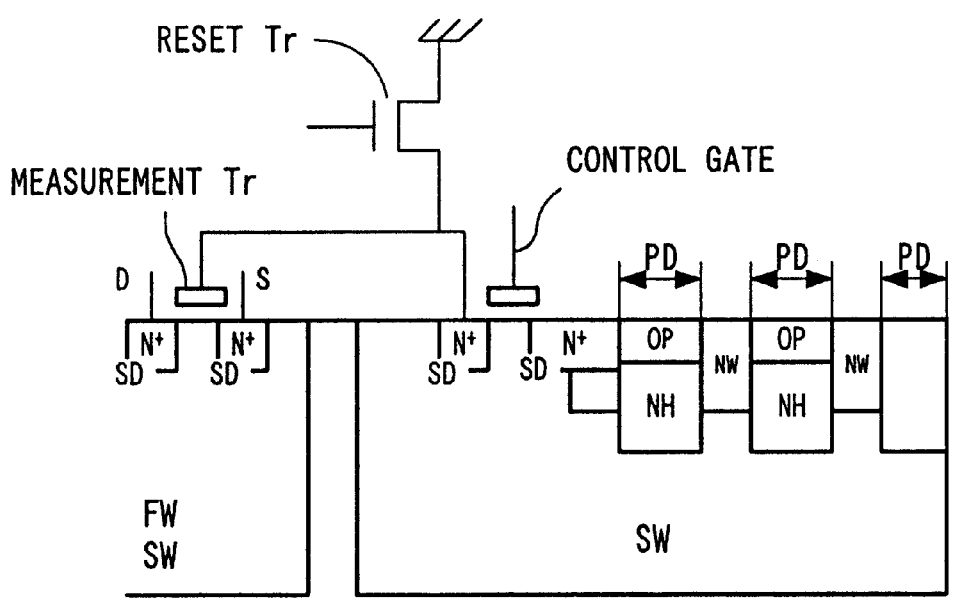

FIG. 14b shows an example of the case where a reset transistor is connected to the select transistor of the photodiode antenna of FIG. 13b. Whether the charge can be released or not by the reset transistor can be investigated to understand the characteristics of the chargeup phenomenon. Further, by comparison with other antenna MOS transistors, the surface leakage between diffusion layers, the resistance fluctuation, and the shielding film effect, the phenomenon can be made clearer and the information of the correlations of the dark current failure and white defect failure of CCD device can be obtained.

As described above, the present invention makes it possible to detect the voltage, the quantity, and the positive or negative state of the chargeup damage caused in the semiconductor device fabrication process. The sensitivity of the detection of the chargeup damage is fine enough to detect even the chargeup in a slight level at which a gate oxide film is not broken and an apparatus provided with such high sensitivity is made available.

The chargeup damage can be detected while completely reflecting the situation taking place in the practical process, a practical product, and a practical device and further precise evaluation is made possible.

Since the measurement method employed is not a time dependent method but a direct and comparative method, the method is effective to carry out measurement within a short time, capable of obtaining numerical values and numerical judgments. Since a variety of kinds of elements and devices, e.g. an antenna MOS, a resistance, diffusion layer leakage, and the like are used for the measurement method, comparison from a variety of aspects can be carried out and more detailed and precise information can be obtained for one and same phenomenon. Further, the method can provide an effect of providing correlations with the product yield ratio. Furthermore, since a shielding film is employed, the method is effective to find the processes in which the chargeup damage takes place. To find the chargeup damage happening process is also made possible based on the difference of the chargeup in a variety of antenna wirings, a variety of processes for diffusion layer antennas, and diffusion resistance.

Additionally, other than a variety of the semiconductor devices according to the embodiment 2, a semiconductor device can be composed by adding a yield ratio evaluation element capable of evaluating the disconnection, the bridge short circuiting, the interlayer leakage, the wiring resistance, the contact resistance, the junction leakage, transistor and device properties relevant to the yield ratio of a diffusion layer, a wiring layer, a connection hole, a transistor, or a variety of elements in respective steps of the semiconductor fabrication process, and the like or can be composed by adding a yield ratio evaluation element equipped with an address decoder circuit for detecting the point at which a failure takes place.

What is claimed is:

1. A semiconductor device comprising elements for evaluation comparison installed in the periphery of a practical device formed in a semiconductor substrate and necessary to be evaluated, wherein the elements are a first semiconductor element comprising a wiring layer having an antenna effect and a second semiconductor element comprising a gate having no wiring layer having said antenna effect but equipped with an electrode.

2. The semiconductor device according to claim 1 composed of any one of a MOS transistor, a bipolar transistor, a CCD transmission element, a CCD light receiving element, a discrete element, and a resistance element comprising a diffusion layer and a wiring layer, these elements in combination, and elements arranged in parallel and selected from these elements.

3. The semiconductor device according to claim 1, comprising a plurality of elements which comprise the wiring layers provided with the antenna effect which the first semiconductor element is provided with and which are installed in the periphery of the practical device while the quality, the type, the size, the surface area, the length, the width, and the intervals of the wiring layers being changed.

4. The semiconductor device according to claim 1, wherein said first semiconductor element comprises the wiring layer having solely the antenna effect or the wiring layer having the antenna effect in combination with a wiring layer having the shielding effect or the wiring layer having the antenna effect in combination with a wiring layer for which the treatment process of the semiconductor fabrication process is added.

5. The semiconductor device comprising elements which have N type and P type impurity types of the diffusion layers or the wiring layers of a variety of the respective semiconductor elements having the structure according to claim 1 and which are installed in the peripheral parts, respectively.

6. The semiconductor device comprising elements installed in the periphery in the case where the first and the second semiconductor elements having the structure according to the claim 1 are diffusion layer elements, wherein said elements are an element in which impurity diffusion layers are disposed face to face at a constant separation distance as to measure and evaluate the leakage current between impurity layers with the same impurity type and an element which has the same structure as that of the former and in which a wiring layer, an insulating layer, or a mask layer having the antenna or shielding effect or subjected to processing treatment or an element subjected to processing treatment is formed on the upper part of the diffusion layer.

7. The semiconductor device comprising a first diffusion resistance element and a second diffusion resistance element in the case where the first and the second semiconductor elements having the structure according to claim 1 are diffusion resistance elements, wherein the first diffusion resistance element installed comprises a second diffusion layer formed in a first diffusion layer and electrodes for resistance measurement attached to the respective ends and a second diffusion resistance element is installed in the periphery of said first diffusion resistance element and is composed by eliminating the electrode structures which are attached to both ends of the second diffusion layer from said first diffusion resistance element all together with the contact hole formation process and leaving the electrode structures attached to both ends of the first diffusion layer resistance element as they are.

8. The semiconductor device comprising a first antenna MOS transistor element and a second antenna MOS transistor element in the case where the first and the second semiconductor elements having the structure according to claim 1 are MOS transistor elements, wherein the first antenna MOS transistor element has an electrode for measurement attached to the gate having the antenna structure and the second antenna MOS transistor element has a floating gate structure composed by eliminating the electrode for measurement attached to the gate having the antenna structure from the above described first antenna MOS transistor element all together with the contact hole formation process and is installed in the periphery of said first antenna MOS transistor element.

9. The semiconductor device comprising a first looped antenna MOS transistor element and a second antenna MOS transistor element in the case where the first and the second semiconductor elements having the structure according to claim 1 are MOS transistor elements, wherein the first looped antenna MOS transistor element has a looped antenna gate or antenna wiring layer connected to the gate of the transistor and the second antenna MOS transistor element is composed by cutting a part of the looped antenna gate or antenna wiring layer of said first looped antenna MOS transistor element and making the gate or wiring layer non-looped and is installed in the periphery of said first antenna MOS transistor element.

10. The semiconductor device comprising a group of first antenna MOS transistor elements and a group of second antenna MOS transistor elements in the case where the first and the second semiconductor elements having the structure according to claim 1 are antenna MOS transistor elements, wherein the group of the first antenna MOS transistor elements have several varied intervals between neighboring antenna gate or antenna wiring layers while keeping the width of the antenna gates or the antenna wiring layers connected to the gates of the respective transistors constant and the group of the second antenna MOS transistor elements have several varied widths of the antenna gates or the antenna wiring layers connected to the gates of the respective transistors while keeping the intervals between neighboring antenna gate or antenna wiring layers constant and are installed in the periphery of said group of said first antenna MOS transistor element.

11. The semiconductor device according to claim 10 comprising one of a plurality of antenna gates or antenna wiring layers composing pattern density and having specified widths and specified intervals, wherein said one of a plurality of the antenna gate or the antenna wiring layers is connected with each gate of the respective transistors of the above described antenna MOS transistor element group.

12. The semiconductor device comprising a structure in the case where the first and the second semiconductor elements having the structure according to claim 1 are antenna MOS transistor elements, wherein the structure is so composed in a manner that the gates of the transistors are connected to the drains of other select MOS transistors, the antenna diffusion layers with the same impurity type as that of the source and drain diffusion layers of the MOS transistors are connected as to be overlaid on the source diffusion layers of the select MOS transistors, and the charge accumulated in the antenna diffusion layers is led to the gates of the antenna MOS transistors by turning on the gates of the select MOS transistors.

13. The semiconductor device has a structure in the case where the first and the second semiconductor elements having the structure according to claim 1 are antenna MOS transistor elements, wherein the structure is so composed in a manner that the gates of the transistors are connected to the drains of other select MOS transistors, the antenna diffusion layers having a device structure with the same impurity type as that of the source and drain diffusion layers of the MOS transistors or an LSI structure or an independent element structure are connected as to be overlaid on the source diffusion layers of the select MOS transistors, and the charge accumulated in the antenna diffusion layers is led to the gates of the antenna MOS transistors by turning on the gates of the select MOS transistors.

14. The semiconductor device according to claim 13 comprising a structure making the operation of the device structure comprising the antenna diffusion layers therein or the LSI structure or the independent element structure possible.

15. The semiconductor device having structures in the case where the first and the second semiconductor elements having the structure according to claim 1 are antenna MOS transistor elements, wherein one structure is so composed in a manner that the gates of the transistors are connected to the drains of other select MOS transistors, the antenna diffusion layers having a device structure with the same impurity type as that of the source and drain diffusion layers of the MOS transistors or an LSI structure or an independent element structure are connected as to be overlaid on the source diffusion layers of the select MOS transistors, and the charge accumulated in the antenna diffusion layers is led to the gates of the antenna MOS transistors by turning on the gates of the select MOS transistors and the other structure is so composed in a manner that the drains of other reset MOS transistors are additionally connected to the gates of the antenna MOS transistor elements, sources of the reset MOS transistors are earthed to a substrate or an electric power source, and the charge accumulated in the gates of the antenna MOS transistor elements is released to the substrate or the electric power source side by turning on the gates of the reset MOS transistor.

16. The semiconductor device additionally comprising a yield ratio evaluation element capable of evaluating disconnection, bridge short circuiting, interlayer leakage, wiring resistance, contact resistance, junction leakage, transistor properties or element properties relevant to the yield ratio of the diffusion layers, the wiring layers, the connection holes, transistors and a variety of elements in the respective steps of the semiconductor fabrication process or a yield ratio evaluation element comprising an address decoder circuit for detecting defective sites, other than a variety of the semiconductor elements actualized according to the claim 1.

* * * * *